(12) United States Patent
Cheng et al.

(10) Patent No.: US 11,610,921 B2
(45) Date of Patent: Mar. 21, 2023

(54) CHIP HAVING A FLEXIBLE SUBSTRATE

(71) Applicant: Au Optronics Corporation, Hsinchu (TW)

(72) Inventors: Hsiang-Chi Cheng, Hsinchu (TW); Yi-Cheng Lai, Hsinchu (TW); Sin-Jie Wang, Hsinchu (TW); Shyh-Bin Kuo, Hsinchu (TW); Kuo-Hsiang Chen, Hsinchu (TW); Yu-Chih Wang, Hsinchu (TW); Chung-Hung Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 380 days.

(21) Appl. No.: 17/033,685

(22) Filed: Sep. 26, 2020

(65) Prior Publication Data

US 2021/0183908 A1  Jun. 17, 2021

Related U.S. Application Data

(60) Provisional application No. 62/947,190, filed on Dec. 12, 2019.

(30) Foreign Application Priority Data

May 19, 2020  (TW) ................. 10911651.8

(51) Int. Cl.
- *H01L 27/14* (2006.01)
- *H01L 27/12* (2006.01)
- *H01Q 1/22* (2006.01)

(52) U.S. Cl.
CPC ...... *H01L 27/1244* (2013.01); *H01L 27/1255* (2013.01); *H01Q 1/2283* (2013.01); *H01L 27/1218* (2013.01)

(58) Field of Classification Search
CPC ............. H01L 27/1244; H01L 27/1255; H01L 27/1218; H01Q 1/2283; H01Q 23/00
USPC ...................................... 257/59, 72
See application file for complete search history.

(56) References Cited

U.S. PATENT DOCUMENTS

2020/0212033 A1* 7/2020 Chung .................... H01L 24/20
2020/0212071 A1  7/2020 Guo et al.

FOREIGN PATENT DOCUMENTS

| CN | 1469451   | 1/2004 |
| CN | 108428705 | 8/2018 |
| CN | 109451252 | 3/2019 |
| TW | I696167   | 6/2020 |

\* cited by examiner

*Primary Examiner* — Tan N Tran
(74) *Attorney, Agent, or Firm* — JCIPRNET

(57) ABSTRACT

A chip is provided. The chip includes a flexible substrate, a plurality of thin-film transistors, a redistribution layer, a first power rail layer, and a second power rail layer. The plurality of thin-film transistors are disposed on the flexible substrate. The redistribution layer is disposed above the plurality of thin-film transistors. The first power rail layer is disposed above the redistribution layer. The first power rail layer provides a first voltage to the plurality of thin-film transistors. The second power rail layer is disposed above the first power rail layer. The second power rail layer provides a second voltage to the plurality of thin-film transistors, wherein the second power rail layer is disposed in a grid shape.

11 Claims, 13 Drawing Sheets

CHIP HAVING A FLEXIBLE SUBSTRATE

CROSS-REFERENCE TO RELATED APPLICATION

This application claims the priority benefits of U.S. provisional application Ser. No. 62/947,190, filed on Dec. 12, 2019, and Taiwan application serial no. 109116518, filed on May 19, 2020. The entirety of each of the above-mentioned patent applications is hereby incorporated by reference herein and made a part of this specification.

BACKGROUND OF THE INVENTION

Field of the Invention

The invention relates to a chip, and particularly to a chip having a flexible substrate.

Description of Related Art

In the prior art, in order to avoid cracking of a chip applied to a flexible substrate during repeated bending, the chip may not be provided with a multilayer metal wiring structure. In this case, fewer layers of metal wirings cause the transistor density in the chip to decrease and the manufacturing cost of the chip to increase.

SUMMARY OF THE INVENTION

The invention provides a chip applied to a flexible substrate. The chip may be provided with a multilayer metal wiring structure, and at the same time avoid the risk of cracking due to the multilayer metal wiring structure.

A chip of the invention includes a flexible substrate, a plurality of thin-film transistors, a redistribution layer, a first power rail layer, and a second power rail layer. The plurality of thin-film transistors are disposed on the flexible substrate. The redistribution layer is disposed above the plurality of thin-film transistors. The first power rail layer is disposed above the redistribution layer. The first power rail layer provides a first voltage to the plurality of thin-film transistors. The second power rail layer is disposed above the first power rail layer. The second power rail layer provides a second voltage to the plurality of thin-film transistors, wherein the second power rail layer is disposed in a grid shape.

Based on the above, the multilayer metal wiring structure is provided in the chip in a grid shape, so that the chip may effectively reduce the risk of cracking, thereby further increasing the transistor density in the chip and reducing the manufacturing cost of the chip.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
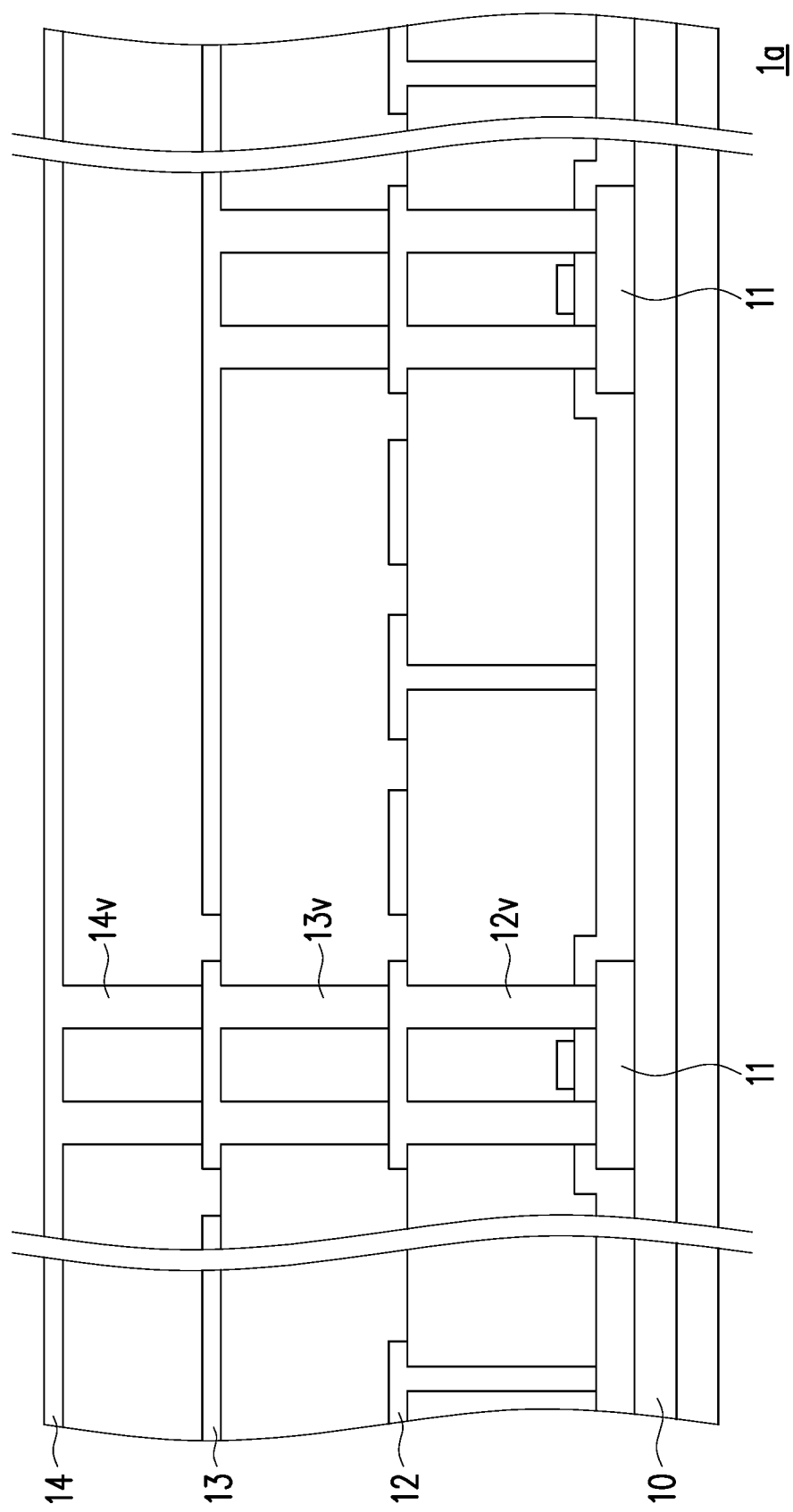
FIG. 1A is a cross-sectional view of a chip of an embodiment of the invention.

FIG. 1A is a cross-sectional view of a chip 1a of an embodiment of the invention. The chip 1a includes a flexible substrate 10, a plurality of thin-film transistors (TFTs) 11, a redistribution layer 12, and power rail layers 13 and 14. In the chip 1a shown in FIG. 1A, the number and arrangement relationship of the thin-film transistors 11 may be adjusted according to different design requirements, and the invention is not limited thereto. The thin-film transistors 11 are disposed on the flexible substrate 10. The redistribution layer 12 is disposed on the plurality of thin-film transistors 11. The power rail layer 13 is disposed on the redistribution layer 12. The power rail layer 14 is disposed on the power rail layer 13. Overall, by disposing the power rail layers 13 and 14 on the redistribution layer 12, the chip 1a may effectively increase the transistor density in the chip 1a and reduce the area required by the chip 1a, so the chip 1a may effectively reduce manufacturing cost.

In detail, the flexible substrate 10 has the characteristic of being bendable, and the flexible substrate 10 may be made of a material such as polyimide (PI). The bendable radius of curvature of the flexible substrate 10 is less than a predetermined radius of curvature. In an embodiment, the bendable radius of curvature of the flexible substrate 10 may be less than 25 millimeters (mm). Since the cost of the flexible substrate 10 in the chip 1a accounts for most of the manufacturing cost of the chip 1a, reducing the area of the flexible substrate 10 in the chip 1a may effectively improve the manufacturing cost of the chip 1a.

The plurality of thin-film transistors 11 are disposed on the flexible substrate. The thin-film transistors 11 may implement arithmetic or other operational functions in the chip 1a. The redistribution layer 12 is disposed above the thin-film transistors 11, a through hole 12v may be disposed between the redistribution layer 12 and the thin-film transistors 11, and the through hole 12v may be a conductive structure. Therefore, the through hole 12v may make the redistribution layer 12 electrically connected to the thin-film transistors 11. The redistribution layer 12 is patterned to be provided with a wiring structure, so according to the connection relationship provided by the redistribution layer 12 and the through hole 12v, the thin-film transistors 11 may perform a pre-programmed computing operation. In an embodiment, the redistribution layer 12 may be made of gold, silver, copper, nickel, indium tin oxide (ITO), or other suitable materials and combinations thereof.

The power rail layer 13 is disposed above the redistribution layer 12. The power rail layer 13 may be connected to an external pad or a power circuit of the chip 1a to obtain a first voltage (for example, ground voltage). A through hole 13v may be disposed between the power rail layer 13 and the thin-film transistors 11. The through hole 13v may be a conductive structure. Therefore, the through hole 13v may provide an electrical connection between the power rail layer 13 and the thin-film transistors 11. The power rail layer 13 is patterned to be provided with a wiring structure. Therefore, via the power rail layer 13 and the through hole 13v, the thin-film transistors 11 may receive a first voltage (for example, ground voltage) required for operation. In an embodiment, the power rail layer 13 may be made of gold, silver, copper, nickel, indium tin oxide (ITO), or other suitable materials and combinations thereof.

The power rail layer 14 is disposed above the power rail layer 13. The power rail layer 14 may be connected to an external pad or a power circuit of the chip 1a to obtain a second voltage (for example, operating voltage). A through hole 14v may be disposed between the power rail layer 14 and the thin-film transistors 11. The through hole 14v may be a conductive structure. Therefore, the through hole 14v may provide an electrical connection between the power rail layer 14 and the thin-film transistors 11. The power rail layer 14 is patterned on top to be provided with a patterned wiring structure. Therefore, via the power rail layer 14 and the through hole 14v, the thin-film transistors 11 may receive a second voltage (for example, operating voltage) required for operation. In an embodiment, the power rail layer 14 may be made of gold, silver, copper, nickel, indium tin oxide (ITO), or other suitable materials and combinations thereof.

Furthermore, since the chip 1a is flexible and has a multilayer structure, in order to improve the flexibility of the chip 1a, the power rail layer 14 in the chip 1a is disposed in a grid shape. In this way, the chip 1a has better consistency in both process uniformity and surface flatness. In other words, the grid-shaped power rail layer 14 may provide the chip 1a with better flexibility to avoid cracking in the chip 1a.

Although in the cross-sectional view shown in FIG. 1A, the through holes 12v, 13v, and 14v are overlapped with each other, those skilled in the art know that the through holes 12v, 13v, and 14v may be structures separated from each other when viewed from top to bottom in the vertical direction of the chip 1a. Therefore, the redistribution layer 12 and the power rail layers 13 and 14 may be electrically connected to the thin-film transistors 11 via the mutually independent paths of the through holes 12v, 13v, and 14v.

Therefore, by disposing the additional power rail layers 13 and 14 on the redistribution layer 11, and by disposing the power rail layers 13 and 14 in a vertical layered structure, the issue of excessive area of the redistribution layer 12 caused by disposing the power rails in the redistribution layer 12 may be effectively avoided. In other words, the additional power rail layers 13 and 14 of the chip 1a may effectively reduce the separation distance of the thin-film transistors 11 in the chip 1a, increase the density of the thin-film transistors 11 in the chip 1a, and at the same time reduce the area of the flexible substrate 11 required for the chip 1a. Therefore, the manufacturing cost of the chip 1a may be effectively reduced.

Figure 1B:
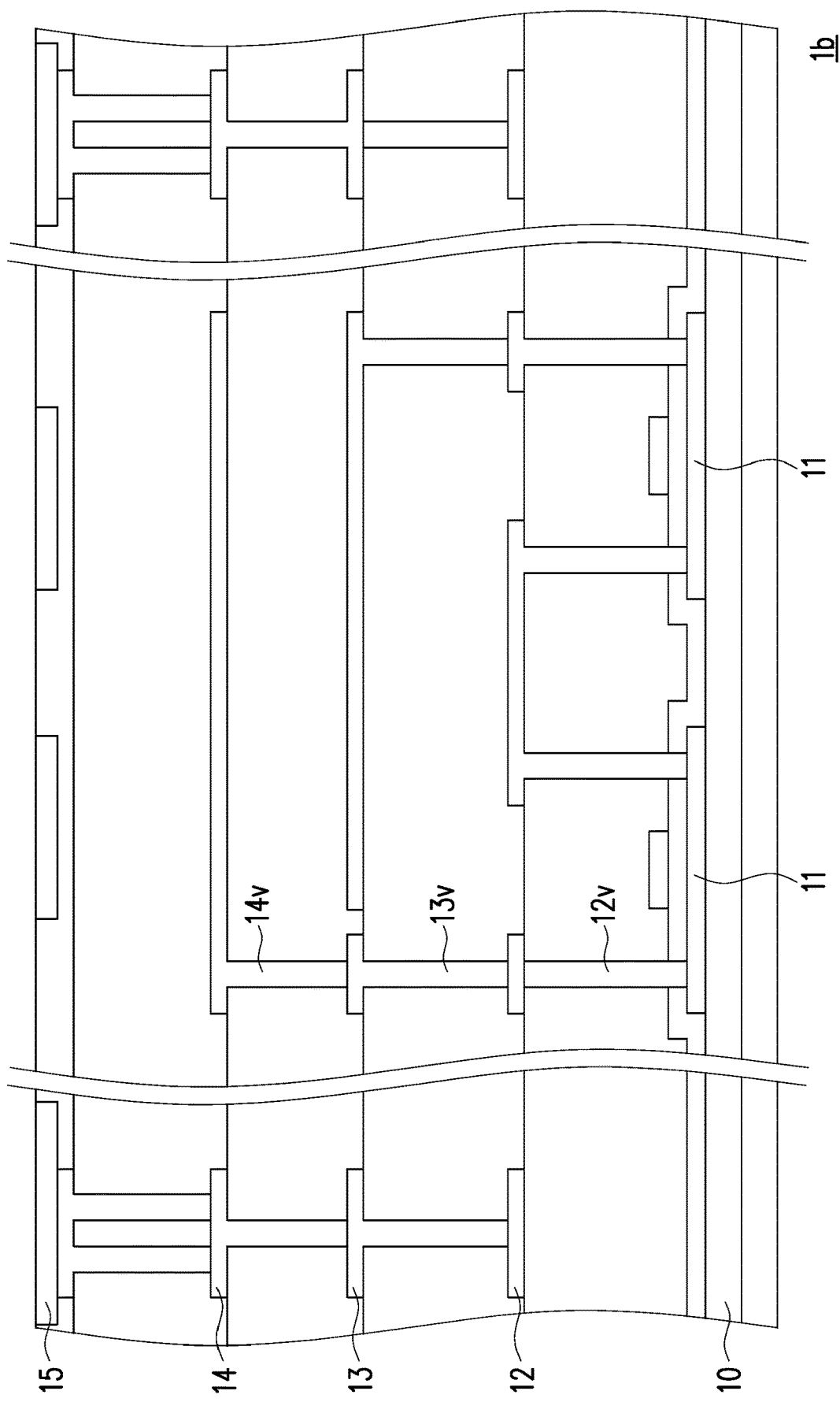
FIG. 1B is a cross-sectional view of a chip of another embodiment of the invention.

FIG. 1B is a cross-sectional view of a chip 1b of another embodiment of the invention. The chip 1b shown in FIG. 1B is similar to the chip 1a shown in FIG. 1A, so the same elements adopt the same reference numerals, and the description of the same elements is provided in related paragraphs above and is not repeated herein. The difference between the chip 1b and the chip 1a is that the chip 1b is also provided with an antenna 15 above the power rail layer 14.

In detail, in some embodiments, the chip 1b must be provided with an antenna structure to meet specific system requirements. In the present embodiment, the antenna 15 is disposed above the power rail layer 14. A through hole 15v may be disposed between the antenna 15 and the thin-film transistors 11, and the through hole 15v may be a conductive structure. Therefore, the through hole 15v may provide an electrical connection between the antenna 15 and the thin-film transistors 11. The antenna 15 is patterned on top to be provided with a patterned antenna structure. Therefore, the antenna structure on the antenna 15 may receive and send a signal for the thin-film transistors 11. In an embodiment, the antenna 15 may be made of gold, silver, copper, nickel, indium tin oxide (ITO), or other suitable materials and combinations thereof.

Furthermore, the antenna 15 may be receive or send a wireless signal for the chip 1b, and therefore the frequency of the signal transmitted and received on the antenna 15 is higher than the signal operated by most of the thin-film transistors 11. In the chip 1b, the distance between the antenna 15 and the thin-film transistors 11 may be effectively increased due to the redistribution layer 12 and the power rail layers 13 and 14. In an embodiment, the distance between the antenna 15 and the thin-film transistors 11 is greater than 13 micrometers, so the interference of the high-frequency signal of the antenna 15 on the operation signal of the thin-film transistors 11 may be effectively reduced. Moreover, since a first voltage (for example, ground voltage) and a second voltage (for example, operating voltage) of direct current are provided on the power rail layers 13 and 14 respectively, the power rail layers 13 and 14 may provide good signal shielding between the antenna 15 and the thin-film transistors 11, so the chip 1b may effectively resist the high-frequency noise of the antenna 15 coupled to the thin-film transistors 11.

In short, the structures of the thin-film transistors 11, the redistribution layer 12, the power rail layers 13 and 14, and the antenna 15 in the chip 1b may effectively improve the signal integrity of the chip 1b. Therefore, the chip 1b may not only effectively reduce the manufacturing cost, but also significantly improve the signal integrity.

FIG. 2A to FIG. 2D are top views of power rail layers 14a to 14d of a plurality of embodiments of the invention viewed downward from the vertical direction. In detail, the power rail layers 14a to 14d may be applied to the chips 1a and 1b shown in FIGS. 1A and 1B. The power rail layers 14a to 14d may have a greater area. In response to the design requirements of different chips, the power rail layers 14a to 14d may have different grid shapes.

Figure 2A:
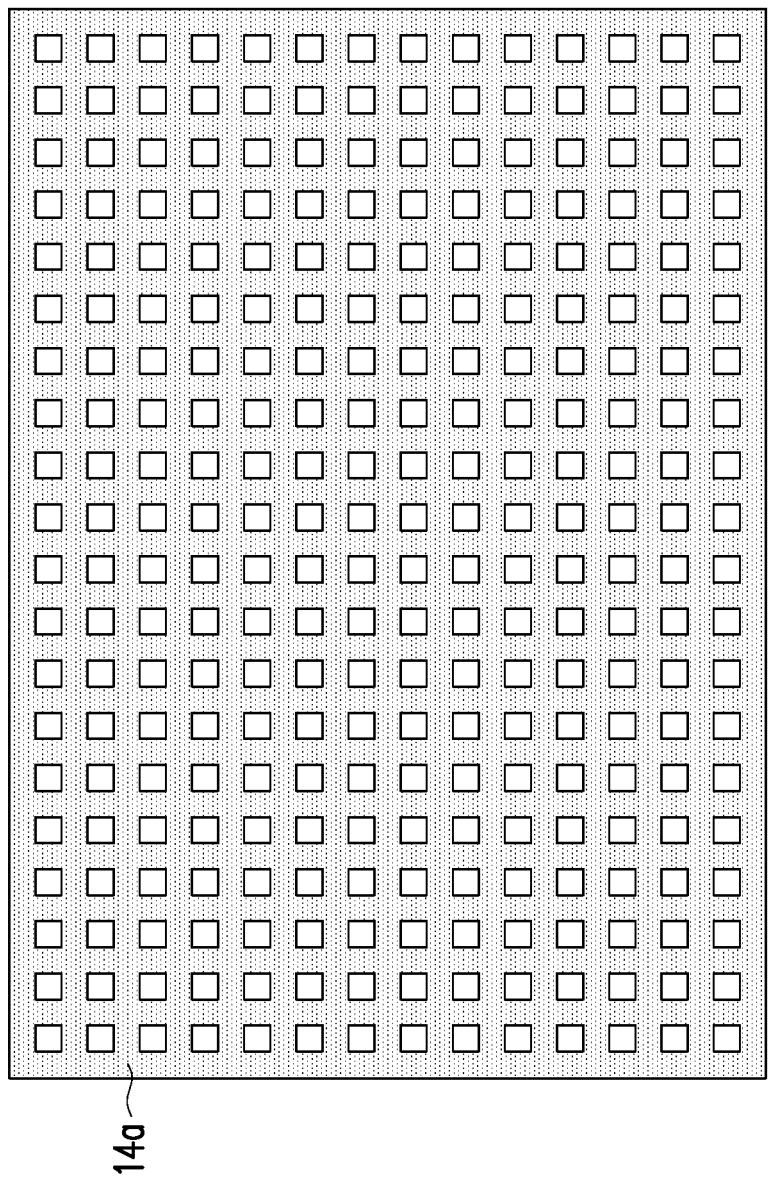
FIG. 2A to FIG. 2D are top views of power rail layers of embodiments of the invention viewed downward from the vertical direction.

As shown in FIG. 2A, the grid shape of the power rail layer 14a has a rectangular outer contour, the inside of the outer contour is provided with a straight and staggered power rail, and a plurality of rectangular grid holes are formed on the inside to form the grid-shaped power rail 14a.

Figure 2B:
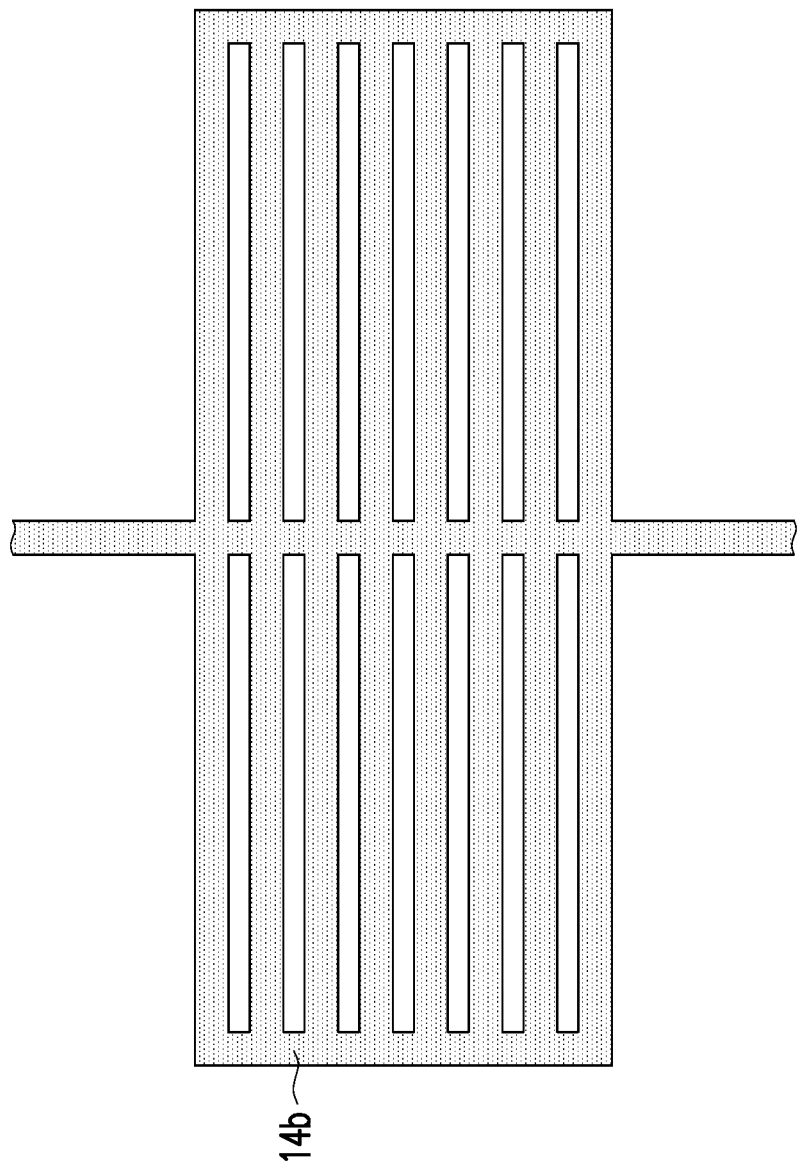

As shown in FIG. 2B, the power rail layer 14b may be provided with a plurality of power rails parallel to a first direction (for example, lateral direction) at a first interval in the power rails with a rectangular contour, and one or a plurality of rectangular power rails may be disposed in a second direction (for example, vertical direction) in the power rails with a rectangular contour, which penetrate the overall rectangular contour to form the grid-shaped power rail 14b.

Figure 2C:
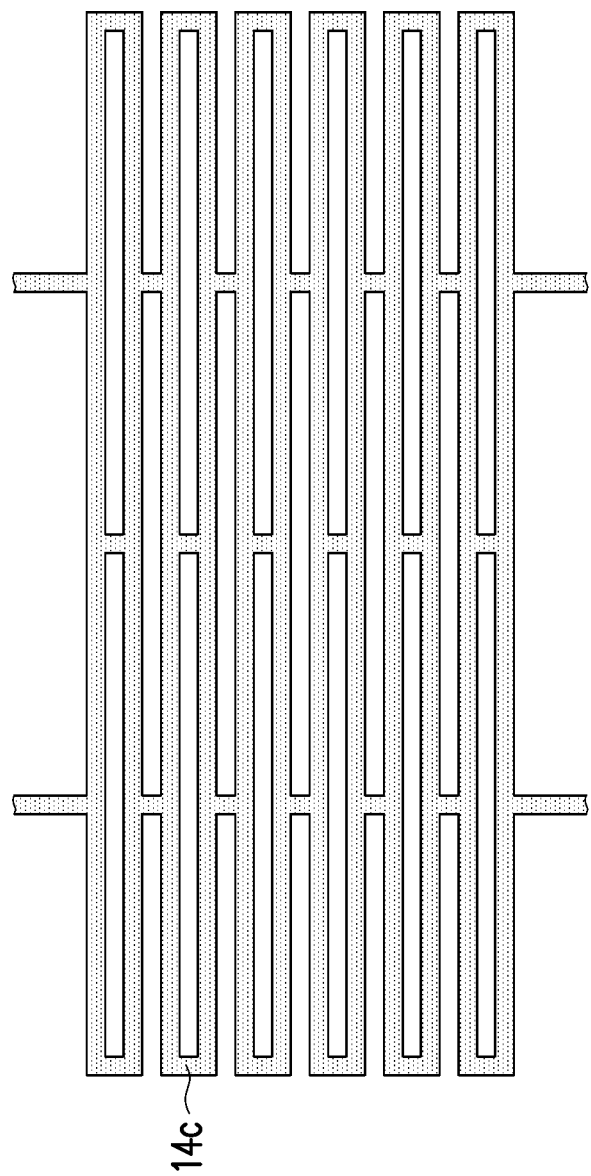

As shown in FIG. 2C, the power rail layer 14c may have a plurality of rectangular power rails, and the power rails with a rectangular contour are staggered with each other to form the grid-shaped power rail 14c.

Figure 2D:
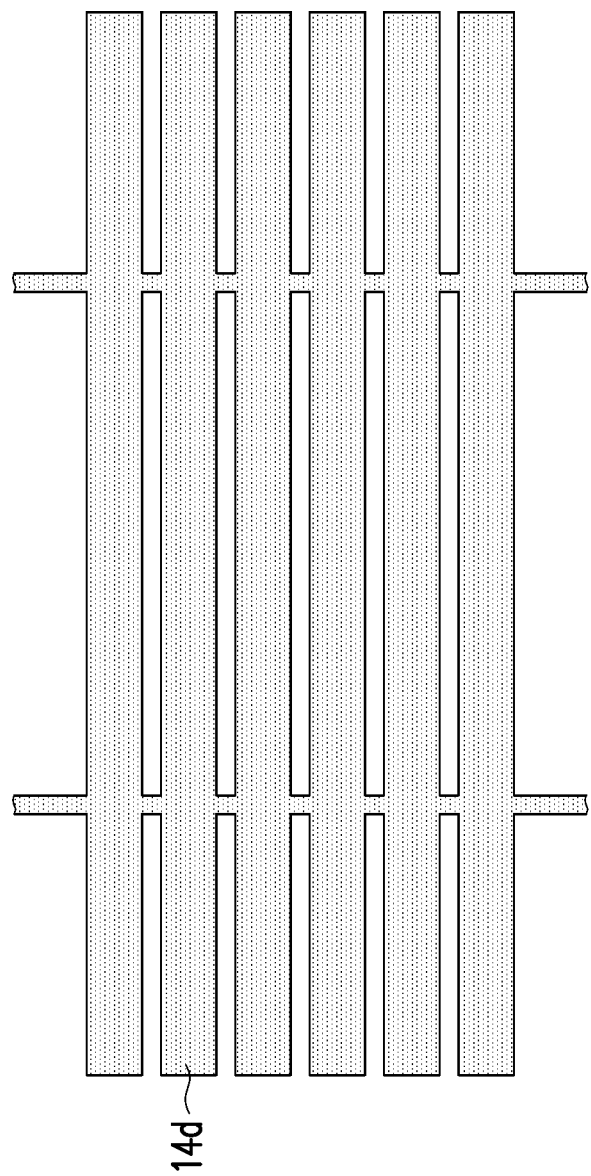

As shown in FIG. 2D, the power rail layer 14d may be regularly provided with a plurality of power rails with a greater width at a first interval in a first direction (for example, lateral direction), and be regularly provided with a rectangular power rail with a smaller width at a second interval in a second direction (for example, vertical direction), thereby forming the grid-shaped power rail 14*d*.

Therefore, the power rail layers 14*a* to 14*d* are disposed in the chips 1*a*/1*b* in a grid shape to improve the process uniformity and surface flatness of the chips 1*a*/1*b*, so that the chips 1*a*/1*b* have better flexibility. Moreover, via the grid-shaped power rail layers 14*a* to 14*d*, the arrangement density of power rails and the capacitance of the power rails may be increased, thereby effectively reducing the disturbance of the second voltage (for example, operating voltage) in the chips 1*a*/1*b* and improving the signal quality of the chips 1*a*/1*b*. In short, by disposing power rails in a grid shape on the power rail layers 14*a* to 14*d*, while increasing the laying density of the power rail layers 14*a* to 14*d* and improving the signal quality of the chips 1*a*/1*b*, the chips 1*a*/1*b* may adapt to different design requirements to increase the design flexibility of the chips 1*a*/1*b*.

Figure 3A:
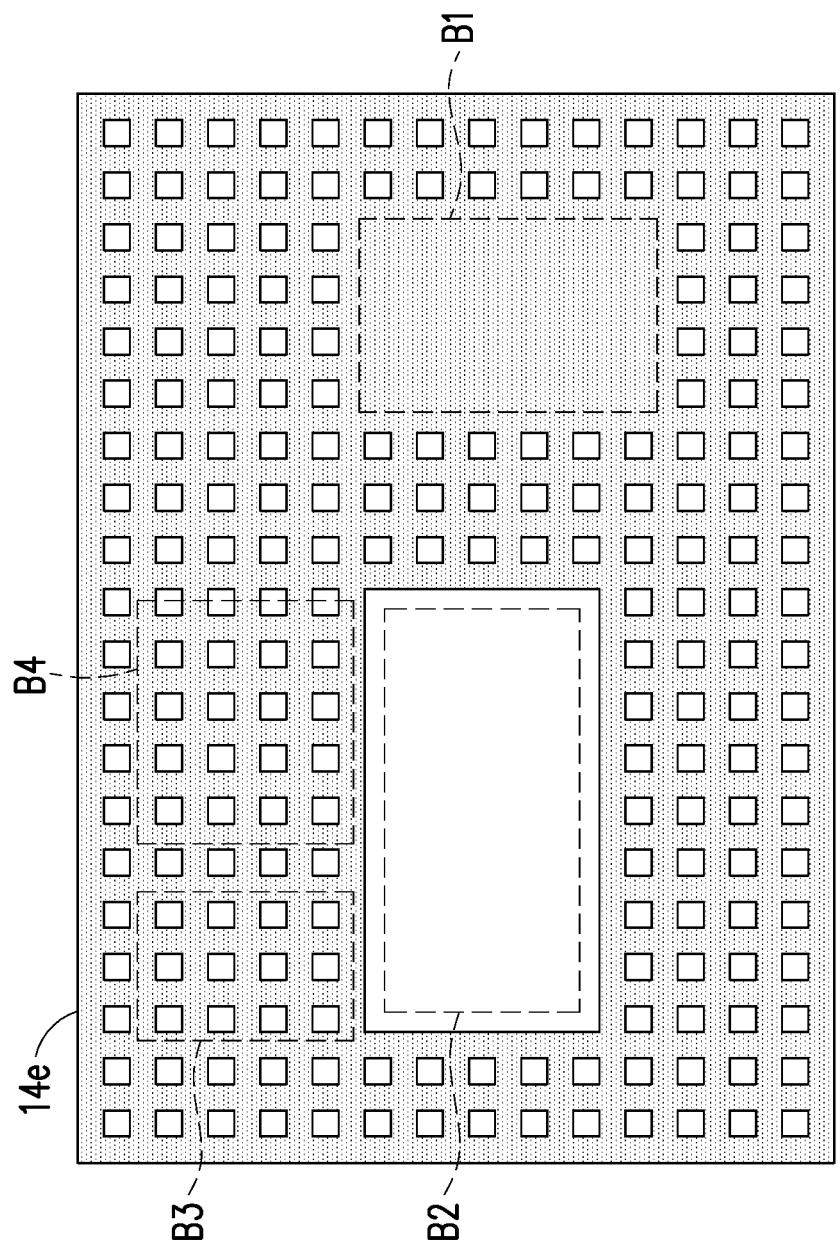
FIG. 3A to FIG. 3D are diagrams of the arrangement of power rail layers of an embodiment of the invention.

FIG. 3A is a diagram of the arrangement of a power rail layer 14*e* of an embodiment of the invention. A portion of the components in the chips 1*a*/1*b* is omitted in FIG. 3A to facilitate understanding of the arrangement of the power rail layer 14*e*. In the present embodiment, the thin-film transistors 11 may form circuit blocks B1 to B4. The power rail layer 14*e* above the circuit block B1 may be a closed plane. In addition, the power rail layer 14*e* above the circuit block B2 may have an opening to expose the circuit block B2. The power rail layer 14*e* above the circuit blocks B3 and B4 may have a grid shape to partially cover the circuit blocks B3 and B4. In other words, when viewed downward in the vertical direction of the power rail layer 14*e*, the circuit block B1 may be completely covered by the power rail layer 14*e*, the circuit block B2 may be exposed, and the circuit blocks B3 and B4 may be partially covered by the power rail layer 14*e*. Therefore, due to different design considerations, for example, the structure of the circuit block B1 needs to be covered to better protect the circuit structure, or the structure of the circuit block B2 needs lower noise interference and is not to be covered by the power rail layer 14*e*. In the above situation, the power rail layer 14*e* may be flexibly disposed in a diverse manner according to the different needs of the power blocks B1 to B4.

Figure 3B:
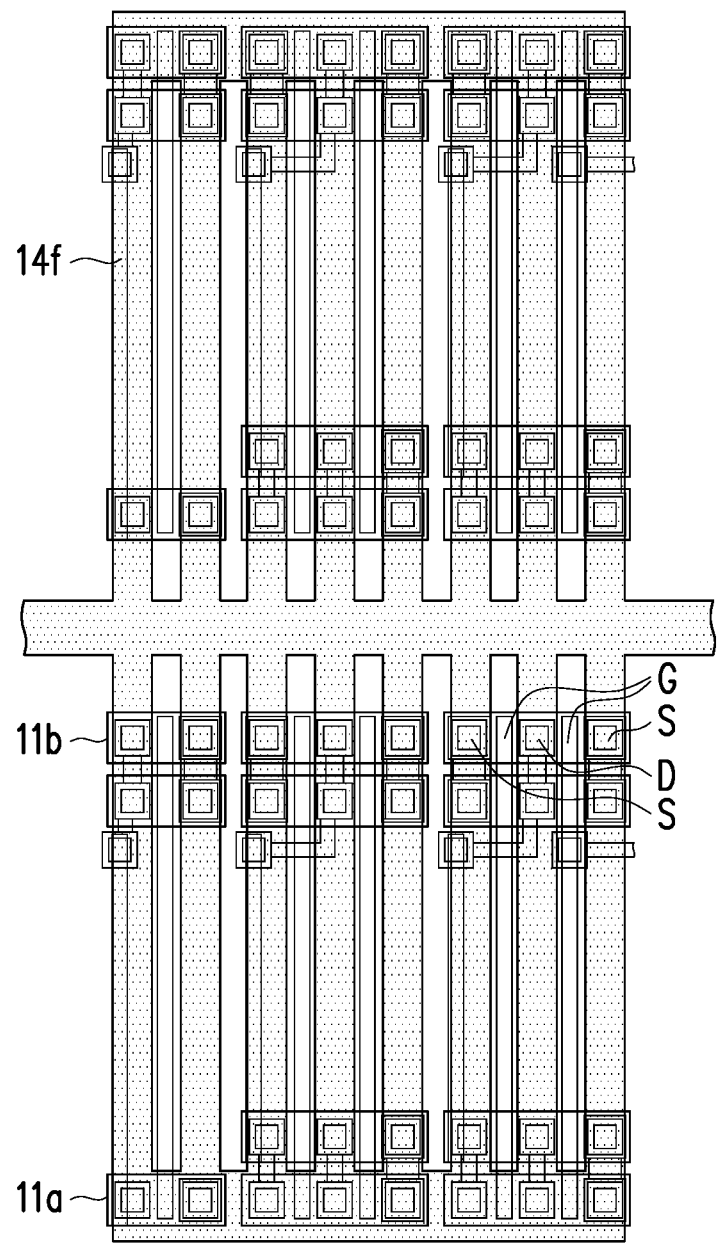
Figure 3C:
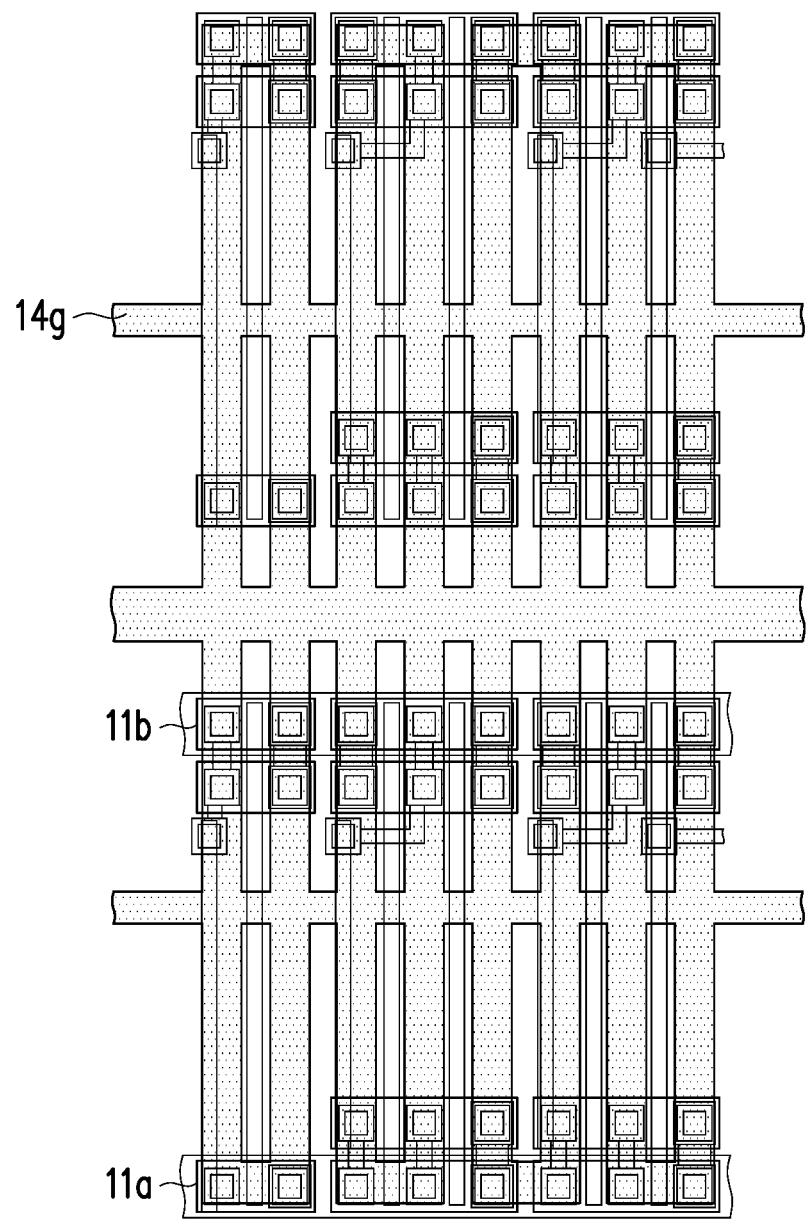

FIGS. 3B and 3C are diagrams of the arrangement of power rail layers 14*f* and 14*g* of an embodiment of the invention. A portion of the components in the chips 1*a*/1*b* is omitted in FIGS. 3B and 3C to facilitate understanding of the arrangement of the power rail layers 14*f* and 14*g*. In FIGS. 3B and 3C, the thin-film transistors 11 may be divided into a thin-film transistor 11*a* and a thin-film transistor 11*b*, and the thin-film transistor 11*a* and the thin-film transistor 11*b* have different first conductivity type and second conductivity type, respectively. For example, the thin-film transistor 11*a* may be an N-type thin-film transistor, and has a low-voltage conductivity type. The thin-film transistor 11*b* may be a P-type thin-film transistor, and has a high-voltage conductivity type. Therefore, the conductivity types of the thin-film transistors 11*a* and 11*b* are complementary. The conductivity types of the thin-film transistors 11*a* and 11*b* are different. The structure of the power rail layer 14*f* shown in FIG. 3B is similar to the power rail layer 14*b* shown in FIG. 2B. The structure of the power rail layer 14*g* shown in FIG. 3C is similar to the power rail layer 14*c* shown in FIG. 2C. In the present embodiment, the power rail layers 14*f* and 14*g* may be partially covered on the thin-film transistors 11*a* and 11*b*. More precisely, the power rail layers 14*f* and 14*g* may be covered above the drain regions and the source regions of the thin-film transistors 11*a* and 11*b* and expose the gate regions of the thin-film transistors 11*a* and 11*b*. In this way, while protecting the circuit structure, the power rail layers 14*f* and 14*g* may also prevent excessive parasitic capacitance between the gates of the thin-film transistors 11*a* and 11*b* and the power rail layers 14*f* and 14*g* from affecting the signal quality of the thin-film transistors 11*a* and 11*b*.

Figure 3D:
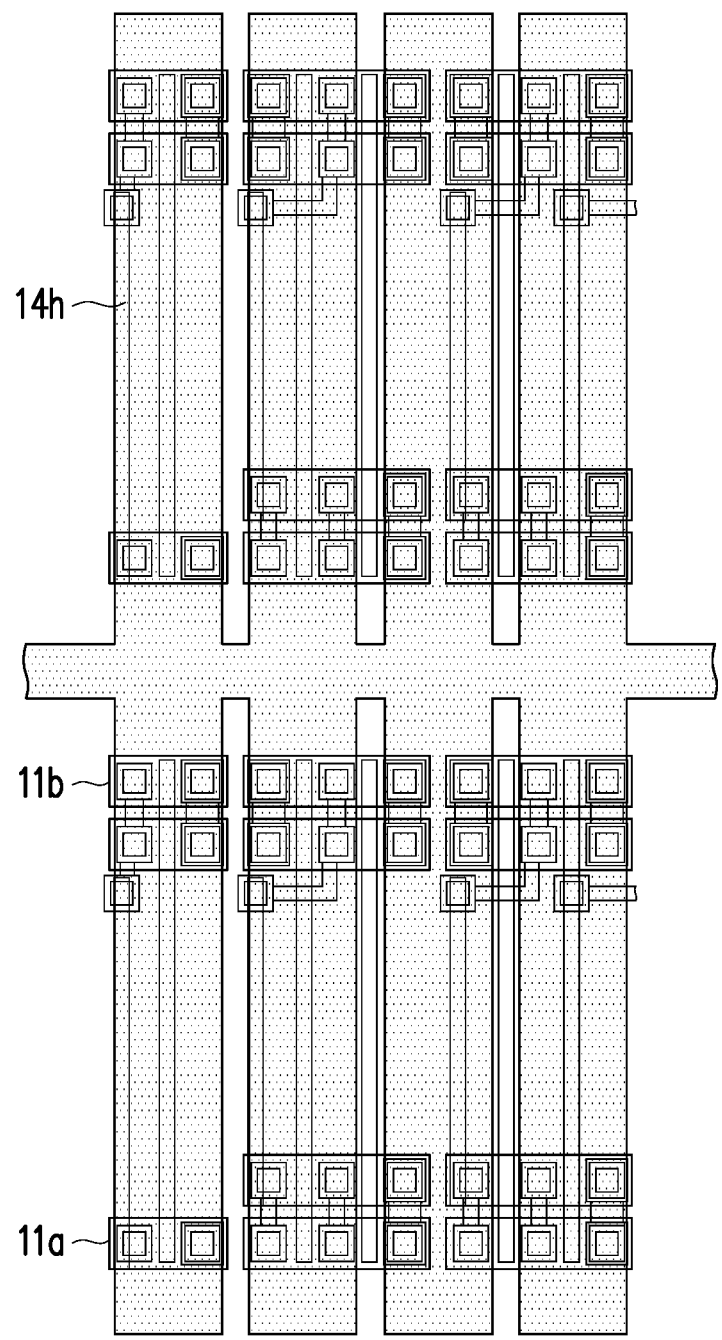

FIG. 3D is a diagram of the arrangement of a power rail layer 14*h* of an embodiment of the invention. The structure of the power rail layer 14*h* shown in FIG. 3D is similar to the power rail layer 14*d* shown in FIG. 2D. In the present embodiment, the power rail layer 14*h* may completely cover the thin-film transistors 11*a* and 11*b*, so the power rail layer 14*h* may achieve a better protection effect for the circuit structure in the chips 1*a*/1*b*.

Although FIGS. 2A to 2D and 3A to 3D only describe the power rail layers 14*a* to 14*h*, the invention is not limited thereto. In other words, the power rail layer 13 in the chips 1*a*/1*b* may also be disposed in a grid shape to achieve a similar effect to the power rail layers 14*a* to 14*h*.

Figure 4A:
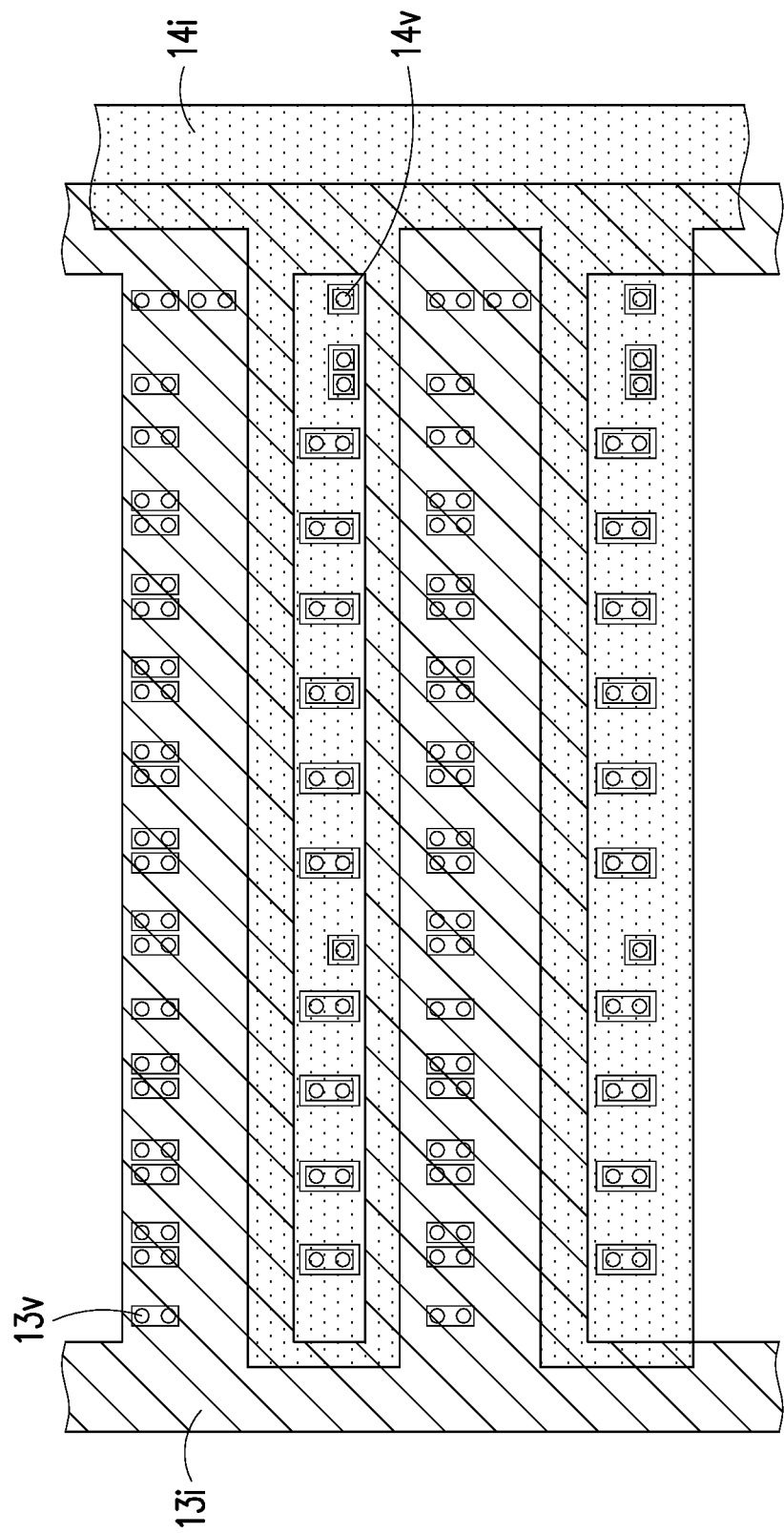
FIG. 4A is a diagram of the arrangement of power rail layers of an embodiment of the invention.

FIG. 4A is a diagram of the arrangement of power rail layers 13*i* and 14*i* of an embodiment of the invention. The power rail layer 13*i* may transmit a first voltage (for example, ground voltage) to the chips 1*a*/1*b*, and the power rail layer 14*i* may transmit a second voltage (for example, operating voltage) to the chips 1*a*/1*b*. In the embodiment shown in FIG. 4A, when the power rail layers 13*i* and 14*i* are viewed downward in a vertical direction, the power rail layers 13*i* and 14*i* may be arranged alternately. The power rail layer 13*i* is covered above the thin-film transistor 11*a* (not shown in FIG. 4A) having a first conductivity type. The power rail layer 13*i* may transmit the first voltage to the thin-film transistor 11*a* having the first conductivity type via the through hole 13*v*. The power rail layer 14*i* is covered above the thin-film transistor 11*b* (not shown in FIG. 4A) having a second conductivity type. The power rail layer 14*i* may transmit the second voltage to the thin-film transistor 11*b* having the second conductivity type via the through hole 14*v*.

Figure 4B:
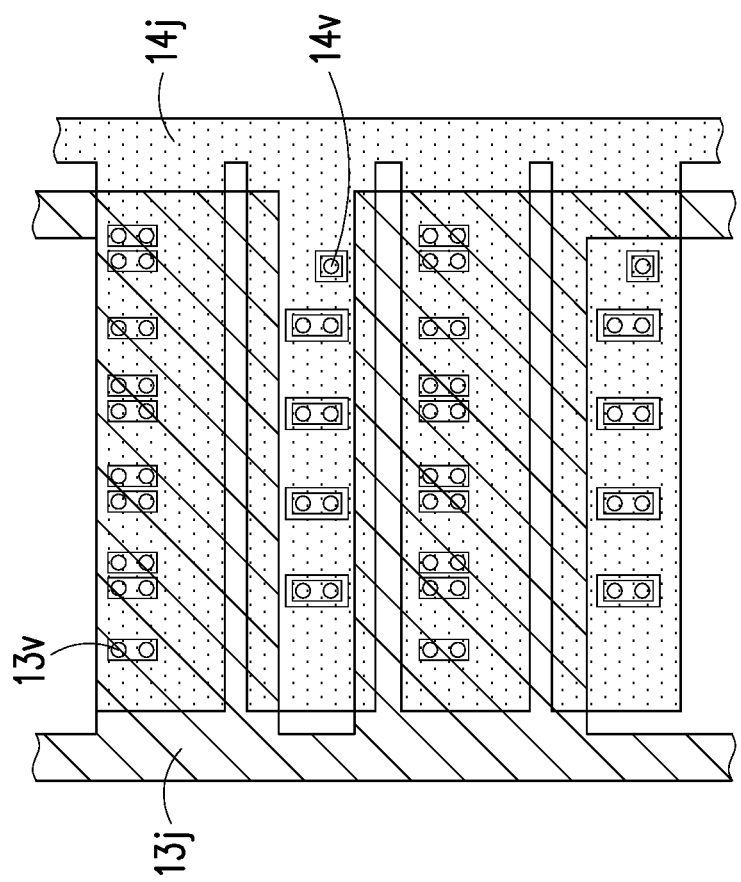
FIG. 4B is a diagram of the arrangement of power rail layers of an embodiment of the invention.

FIG. 4B is a diagram of the arrangement of power rail layers 13*j* and 14*j* of an embodiment of the invention. In the embodiment shown in FIG. 4B, the power rail layer 13*j* is covered above the thin-film transistor 11*a* having the first conductivity type. The power rail layer 13*j* may transmit a first voltage to the thin-film transistor 11*a* (not shown in FIG. 4B) having a first conductivity type via the through hole 13*v*. The power rail layer 14*j* is covered above all the thin-film transistors 11*a* and 11*b* (not shown in FIG. 4B). The power rail layer 14*j* may transmit a second voltage to the thin-film transistor 11*b* having a second conductivity type via the through hole 14*j*.

Figure 4C:
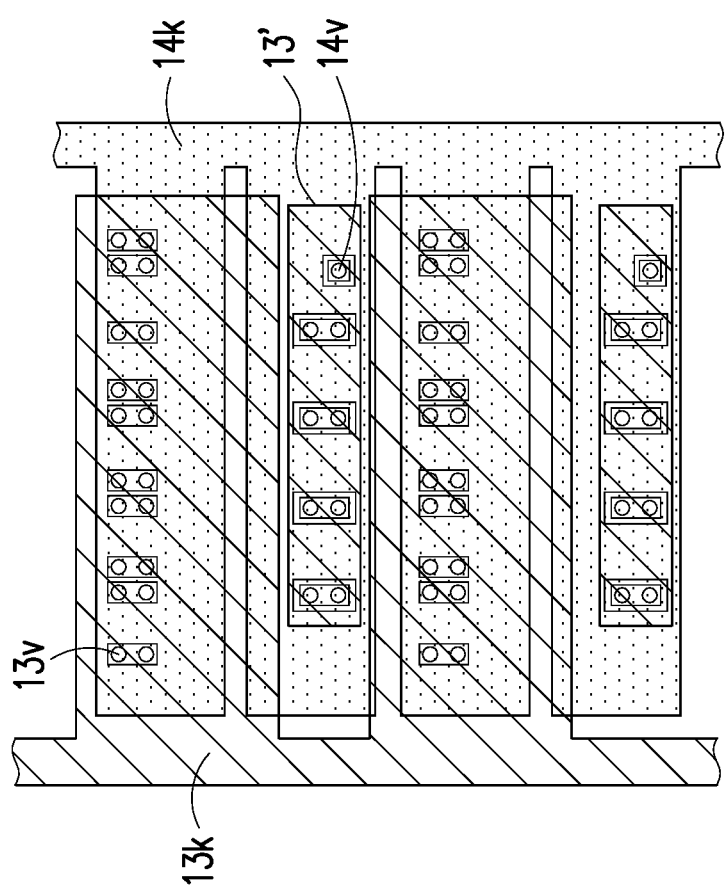
FIG. 4C is a diagram of the arrangement of power rail layers of an embodiment of the invention.

FIG. 4C is a diagram of the arrangement of power rail layers 13*k* and 14*k* of an embodiment of the invention. The power rail layers 13*k* and 14*k* shown in FIG. 4C are respectively similar to the power rail layers 13*j* and 14*j* shown in FIG. 4B, except that in FIG. 4C, the power rail layer 14*k* may additionally be provided with a power rail layer 13' on a path on which the second voltage is transmitted to the thin-film transistor 11*b* via the through hole 14*v*. The power rail layer 13' may be disposed on the same structure layer as the power rail layer 13*k*, but the power rail layer 13' is not electrically connected to the power rail layer 13*k*. Therefore, in the embodiment shown in FIG. 4C, the power rail layer 13*k* is covered above the thin-film transistor 11*a* having a first conductivity type. The power rail layer 13*k* may transmit a first voltage to the thin-film transistor 11*a* (not shown in FIG. 4C) having the first conductivity type via the through hole 13*v*. The power rail layer 13' is covered above the thin-film transistor 11*b* having a second conductivity type. The power rail layer 14k is covered above all the thin-film transistors 11a and 11b (not shown in FIG. 4B). The power rail layer 14j may transmit a second voltage to the thin-film transistor 11b having the second conductivity type via the through hole 14j and the power rail layer 13'.

Based on the above, the multilayer metal wiring structure is provided in the chip of the invention in a grid shape, so that the chip may effectively reduce the risk of cracking, thereby further increasing the transistor density in the chip and reducing the manufacturing cost of the chip.

What is claimed is:

1. A chip, comprising:
   a flexible substrate;
   a plurality of thin-film transistors disposed on the flexible substrate;
   a redistribution layer disposed above the thin-film transistors;
   a first power rail layer disposed above the redistribution layer to provide a first voltage to the thin-film transistors; and
   a second power rail layer disposed above the first power rail layer to provide a second voltage to the thin-film transistors, wherein the second power rail layer is disposed in a grid shape;
   an antenna disposed above the second power rail layer, wherein the antenna is coupled to the thin-film transistors.

2. The chip of claim 1, wherein a bendable radius of curvature of the flexible substrate is less than a predetermined radius of curvature.

3. The chip of claim 1, wherein the flexible substrate comprises polyimide (PI).

4. The chip of claim 1, wherein in a vertical projection of the chip, the second power rail layer at least partially covers the thin-film transistors.

5. The chip of claim 4, wherein the second power rail layer covers a drain region and a source region of the thin-film transistors.

6. The chip of claim 4, wherein the thin-film transistors form a plurality of circuit blocks, and the second power rail layer covers a first circuit block in the circuit blocks.

7. The chip of claim 4, wherein the first power rail layer covers all the thin-film transistors, and the second power rail layer covers all the thin-film transistors.

8. A chip, comprising:
   a flexible substrate;
   a plurality of thin-film transistors disposed on the flexible substrate;
   a redistribution layer disposed above the thin-film transistors;
   a first power rail layer disposed above the redistribution layer to provide a first voltage to the thin-film transistors; and
   a second power rail layer disposed above the first power rail layer to provide a second voltage to the thin-film transistors, wherein the second power rail layer is disposed in a grid shape;
   wherein the thin-film transistors may be divided into a plurality of first thin-film transistors and a plurality of second thin-film transistors, the first thin-film transistors have a first conductivity type, the second thin-film transistors have a second conductivity type, and the first conductivity type is different from the second conductivity type.

9. The chip of claim 8, wherein the first power rail layer covers the first thin-film transistors, and the second power rail layer covers the second thin-film transistors.

10. The chip of claim 9, wherein the first power rail layer and the second power rail layer are staggered.

11. The chip of claim 8, wherein the first power rail layer covers the first thin-film transistors, and the second power rail layer covers all the thin-film transistors.

* * * * *